(12) United States Patent
Arambepola et al.

(10) Patent No.: US 10,305,714 B2
(45) Date of Patent: *May 28, 2019

(54) METHOD AND APPARATUS FOR FREQUENCY INTERLEAVING

(71) Applicant: Intel Corporation, Santa Clara, CA (US)

(72) Inventors: Bernard Arambepola, Enfield (GB); Parveen K. Shukla, Nottingham (GB); Thushara Hewavithana, Hatfield (GB); Sahan S. Gamage, Cambridge (GB)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/882,156

(22) Filed: Jan. 29, 2018

(65) Prior Publication Data

US 2018/0287842 A1    Oct. 4, 2018

Related U.S. Application Data

(63) Continuation of application No. 14/081,586, filed on Nov. 15, 2013, now Pat. No. 9,954,708.

(51) Int. Cl.
| | |
|---|---|
| *H04L 27/00* | (2006.01) |
| *H04B 7/02* | (2018.01) |
| *H04L 27/26* | (2006.01) |
| *G06F 12/00* | (2006.01) |
| *G06F 7/76* | (2006.01) |
| *H03M 13/27* | (2006.01) |
| *H04L 1/00* | (2006.01) |

(52) U.S. Cl.
CPC .......... *H04L 27/2627* (2013.01); *G06F 7/768* (2013.01); *G06F 12/00* (2013.01); *H03M 13/271* (2013.01); *H04L 1/0071* (2013.01); *H04L 27/263* (2013.01); *H04L 27/2628* (2013.01); *H04L 27/2634* (2013.01); *H05K 999/99* (2013.01)

(58) Field of Classification Search
USPC ....... 375/219, 220, 222, 221, 259, 284, 285, 375/278, 295, 316, 324, 340, 346, 347, 375/348, 372, 371
See application file for complete search history.

(56) References Cited

U.S. PATENT DOCUMENTS 4,649,419 A    3/1987   Arragon et al.
9,954,708 B2 * 4/2018   Arambepola ....... H04L 27/2627
(Continued)

*Primary Examiner* — Linda Wong
(74) *Attorney, Agent, or Firm* — Alliance IP, LLC

(57) ABSTRACT

The disclosure generally relates to a method and apparatus for frequency interleaving. Specifically, an embodiment of the disclosure relates to a communication system having one or more antennas, a radio, a memory circuit, and a processor circuit. The antennas can be used to communicate signals or to comply with different transmission protocols. The radio can be configured to send and receive radio signals. The memory can communicate with the processor circuit and contain instructions for the processor circuit to write data carriers along a plurality of rows and columns of a 2-D store in bit-reversed order and read the columns of 2-D store.

27 Claims, 10 Drawing Sheets

(56) References Cited

U.S. PATENT DOCUMENTS

| | | | |
|---|---|---|---|
| 2002/0035709 A1* | 3/2002 | Chen | H03M 13/271 |
| | | | 714/702 |
| 2006/0227892 A1* | 10/2006 | Ouyang | H04B 7/04 |
| | | | 375/267 |
| 2007/0019747 A1* | 1/2007 | Aldana | H03M 13/271 |
| | | | 375/260 |
| 2009/0254795 A1* | 10/2009 | Palanki | H03M 13/2757 |
| | | | 714/776 |
| 2009/0327843 A1* | 12/2009 | Palanki | H03M 13/2757 |
| | | | 714/776 |
| 2010/0325510 A1* | 12/2010 | Nogami | H04B 1/7107 |
| | | | 714/750 |
| 2013/0202001 A1* | 8/2013 | Zhang | H04L 29/10 |
| | | | 370/476 |
| 2014/0072081 A1* | 3/2014 | Atungsiri | H04L 1/0071 |
| | | | 375/340 |
| 2014/0269960 A1* | 9/2014 | Petrov | H04L 27/3444 |
| | | | 375/261 |
| 2015/0063484 A1* | 3/2015 | Kliger | H03M 13/2707 |
| | | | 375/267 |
| 2015/0188734 A1* | 7/2015 | Petrov | H03M 13/116 |
| | | | 375/260 |

* cited by examiner

METHOD AND APPARATUS FOR FREQUENCY INTERLEAVING

RELATED APPLICATIONS

This application is a continuation and claims priority under 35 U.S.C. § 120 of pending U.S. patent application Ser. No. 14/081,586, filed Nov. 15, 2013, entitled METHOD AND APPARATUS FOR FREQUENCY INTERLEAVING. The entire disclosure(s) of these documents are incorporated by reference herein for all purposes.

BACKGROUND

Field

The disclosure relates to a method and apparatus for frequency interleaving. More specifically, the disclosure relates to a method and apparatus for structured interleaving of symbols with randomization such that periodic interference patterns affecting performance are substantially eliminated.

Description of Related Art

Conventional wireless communication systems employ one or more interleaving schemes to reduce errors in transmission. Interleaving, for example, may help reduce the number of undetected error bursts especially in channels with memory (i.e., fading channels). Interleaving is generally performed after channel encoding and permutes bits in a regular or predetermined fashion prior to modulation and transmission. Upon reception and after demodulation, a de-interleaving process is performed to restore the original bit sequence. Some orthogonal frequency division multiplexed (OFDM) systems use coding and frequency interleaving to help overcome problems associated with transmitting data over frequency-selective (i.e., fading) channels.

Interleaving exploits frequency diversity by spreading any locally deep fades within the channel across the transmission bandwidth. Block interleaving is one form of interleaving in which a block of bits is inputted to a matrix in one fashion (e.g., row-by-row) and outputted from the matrix in another fashion (e.g., column-by-column). Writing the data in sequential order along rows or columns does not maximize the separation of the interleaved bits. Further, block interleaving and other conventional interleaving schemes spread the noise in a predictable manner and are susceptible to reemergence of periodic interference and/or noise.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Frequency interleaving is very beneficial in broadband OFDM-based transmission systems. Broadband OFDM transmissions are susceptible to interference from other communication devices using the same frequency. Interleaving helps disperse interfered carriers among multiple forward error correction blocks. In modern communication systems forward error correction is usually implemented using low-density parity-check (LDPC) codes. In one embodiment, the disclosure provides a structured mechanism to maximize the carrier spacing through a novel interleaving methodology. In another embodiment, the disclosure provides for randomization to prevent susceptibility to periodic interference. The disclosed methods and apparatus are particularly suitable for use with next generation Data Over Cable Interface Specification (DOCSIS) standard.

Figure 1:
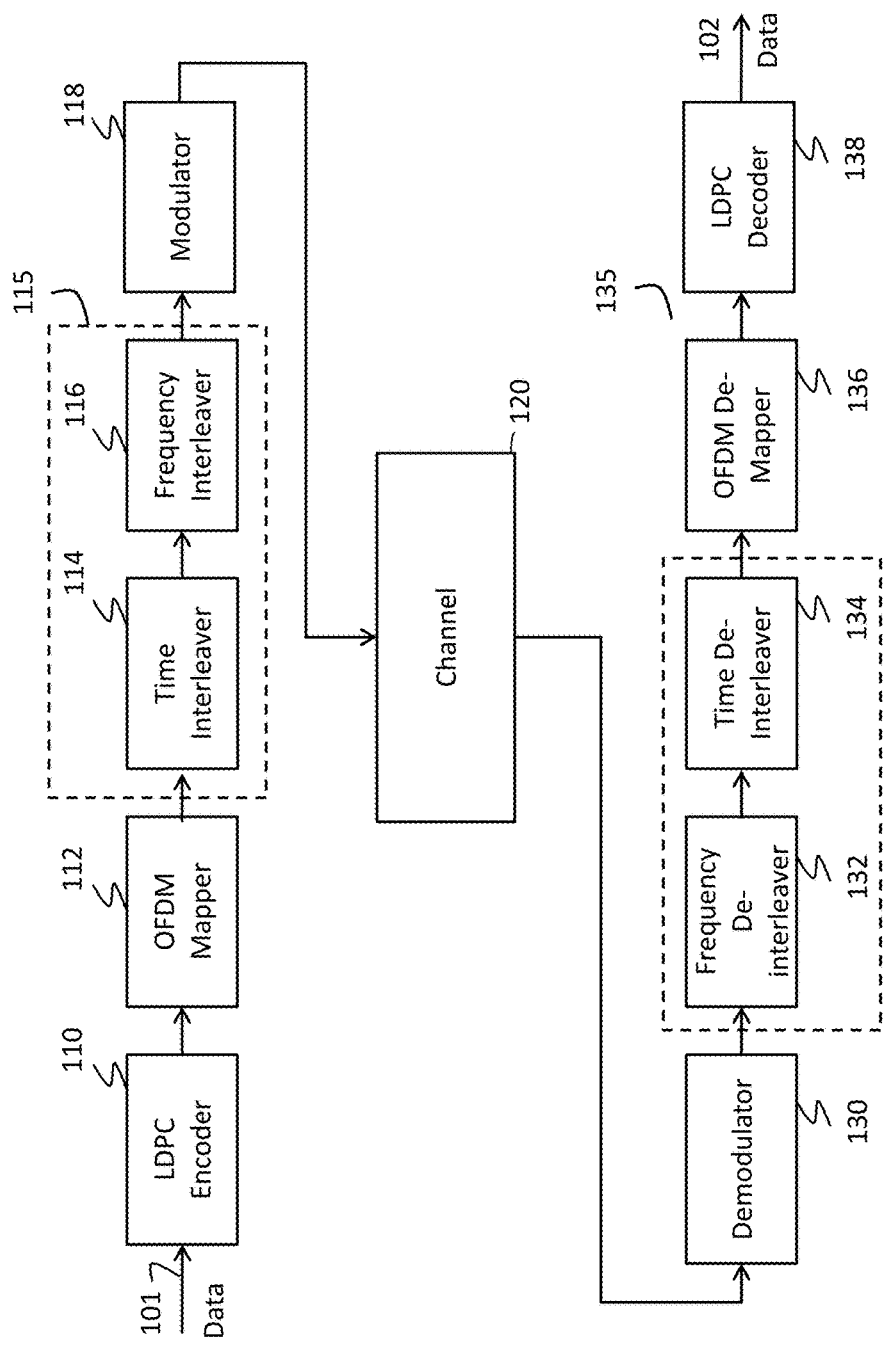
FIG. 1 is a block diagram of a communication system according to one embodiment of the disclosure.

FIG. 1 is a block diagram of a communication system according to one embodiment of the disclosure. In FIG. 1, data 101 is received by LDPC encoder 110 which encodes incoming data 101 to LDPC symbols (or code words). OFDM Mapper 112 maps the incoming symbols data to symbols having orthogonal subcarriers. Interleaver 115 may optionally comprise a time interleaver 114 and frequency interleaver 116. The elements of FIG. 1 may be implemented in hardware, software, firmware or any combination thereof. For example, the system of Fig. can be implemented on a communication system having an antenna, a radio and processing modules. In another example, the one or more of elements 110-118 can be implemented at one or more processors having the requisite instruction software or a firmware.

Time interleaving is carried out to mitigate the effects of burst noise. The function of time interleaver 114 is to disperse the subcarriers of an OFDM symbol over a multiplicity of transmitted OFDM symbols. The reverse operation, that is, time de-interleaving is performed at the receiver, which results in the subcarriers of a received symbol being collected from a number of transmitted symbols. Therefore, if all or most of the subcarriers of a transmitted symbol are corrupted as a result of a noise burst, the time de-interleaver at the receiver spreads these corrupted subcarriers over a number of received symbols, allowing the forward error correction module, for example, an LDPC decoder, to correct for the errors caused by the burst noise.

Frequency interleaving is carried out to mitigate the effect of ingress noise. Ingress noise is caused by radio frequency interference and may affect a number of consecutive subcarriers of many OFDM symbols. The frequency interleaver 116 changes the frequency locations of the individual OFDM data carriers within an OFDM symbol, that is, frequency interleaving disperses the subcarriers over the OFDM symbol. Frequency de-interleaving at the receiver performs the inverse operation, and as a result, distributes the ingress affected subcarriers over a multiplicity of forward error correction blocks, in the illustration in FIG. 1, over a number of LDPC codewords.

According to one embodiment of the disclosure, frequency interleaver 116 applies bit-reversed order interleaving to incoming OFDM symbols. Bit-reversed permutation is a rearrangement technique. Let a number A be represented in binary notation as $\{a_{n-1}, a_{n-2}, \ldots, a_0\}$, where $a_i \in \{0,1\}$. Then $A = \sum_{i=0}^{n-1} a_i 2^i$. The bit-reversed version of the number A, denoted here by B, is given by the equation $B = \sum_{i=0}^{n-1} a_{n-i-1} 2^i$. In other words the binary representation of B is $\{a_0, a_1, \ldots, a_{n-1}\}$ which is the reversed form for the binary representation of number A.

As stated, the frequency interleaver works on individual OFDM symbols. In one embodiment of the disclosure, frequency interleaver 116 creates a 2-D matrix (interchangeably, 2-D store) having 128 rows and K columns. The 2-D store is then used for rearrangement consistent with the bit-reversed order algorithm.

Figure 2:
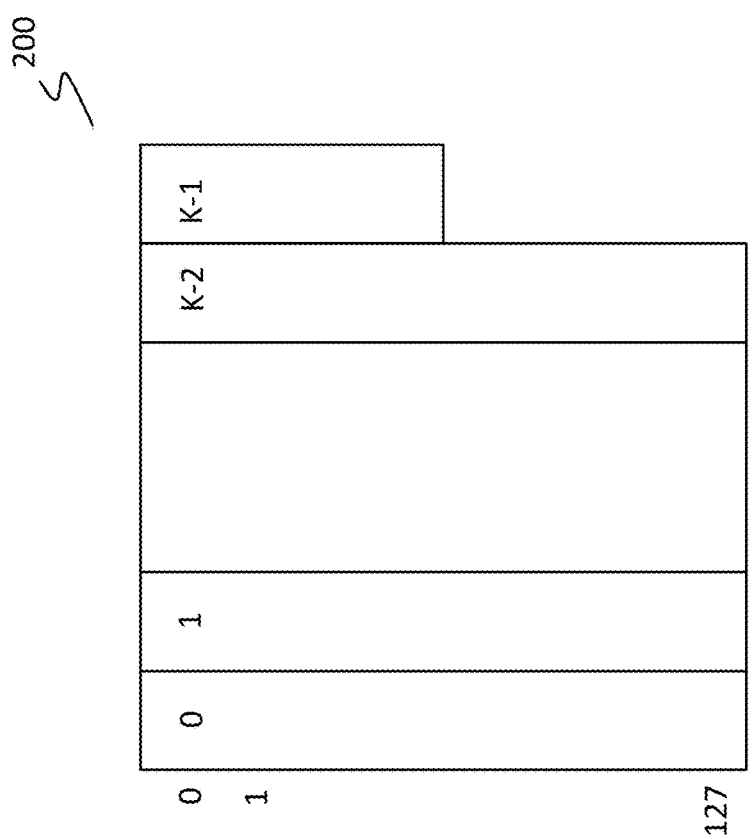
FIG. 2 illustrates an exemplary 2-D store for bit-reversed interleaving.

FIG. 2 illustrates an exemplary 2-D store for bit-reversed interleaving. Specifically, FIG. 2 shows a 2-D store 200 having 128 rows (rows 0-127) and K columns (columns 0 to K−1). If the number of data carriers in the OFDM symbol is N, then the number of columns K is given by equation (1):

$$K = \operatorname{ceiling}\left(\frac{N}{128}\right) \quad (1)$$

If N is not a multiple of 128, then the integer value that is greater than the fraction (N/128) is taken as K. If N is not an integer multiple of 128, then the last column of 2-D store 200 will be partially filled during the interleaving process. The number of elements in the last column can be determined by equation (2):

$$C = N - 128(K-1) \quad (2)$$

Figure 3:
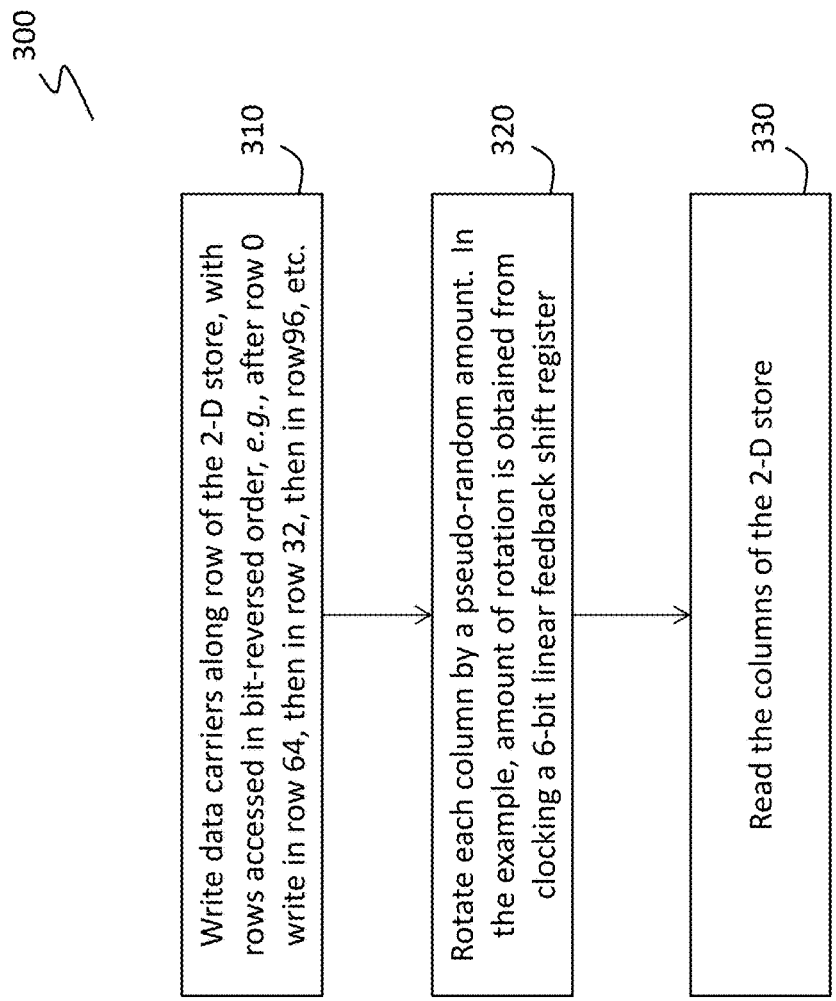
FIG. 3 is an exemplary flow-diagram for a frequency interleaver according to one embodiment of the disclosure.

FIG. 3 is an exemplary flow-diagram for a frequency interleaver according to one embodiment of the disclosure. Flow diagram 300 can be implemented, for example, at the Frequency Interleaver 116 of FIG. 1. At step 310, the frequency interleaver writes data carriers along the rows of the interleaver matrix (e.g., the 2-D store 200 of FIG. 2). Here, rows may be accessed in bit-reversed order. For example, subsequent to writing in row 0, instead of writing in row 1, next writing is done in the row with index that is the bit-reversed representation of 1, that is, the next writing operation will be in row 64. This will be followed by writing in row 32 and so on. If the row number is less than C, then K elements will be written in the row. Otherwise, only (K−1) elements will be written. That is, if the row number is less than C, then a partial column will be formed in the 2-D store.

At step 320 the columns are rotated by an amount defined using a pseudo-random-number generator. In the exemplary embodiment of FIG. 3, columns 0 to (K−2) are rotated by an amount given by a 6-bit shift maximal length linear feedback shift register. The shift register is initialized to a value of 17 at the start of each OFDM symbol. The final column (i.e., (K−1))—which may be partially filled—is not rotated.

At step 330, the columns are read. In this manner, the 2-D store shown in FIG. 2 is populated with data carrier symbols representing the incoming data 101 (FIG. 1) to form a structure configured to spread noise and interference over the entire bandwidth.

Figure 4:
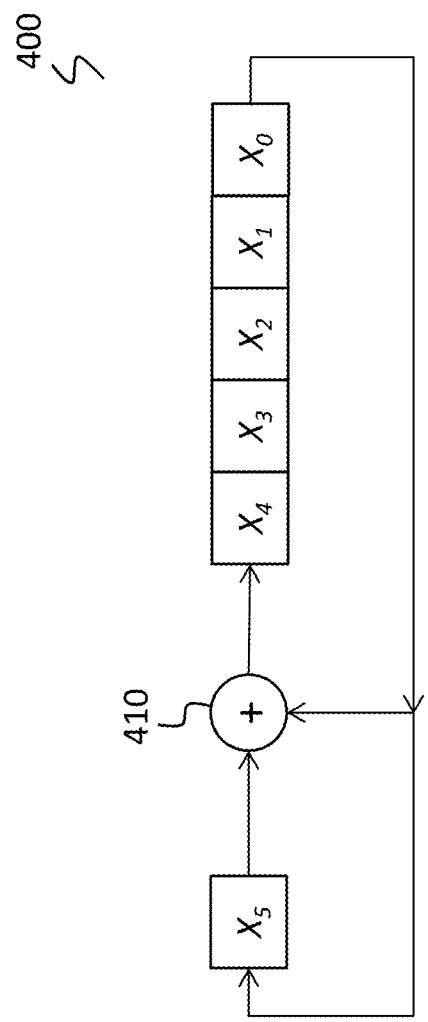
FIG. 4 shows an exemplary linear feedback shift register for use with an embodiment of the disclosure.

FIG. 4 shows an exemplary linear feedback shift register for use with an embodiment of the disclosure. Shift register 400 illustrates a 6 bit linear feedback register. These 6 bits form a 6-bit binary number with number range 0 to 63. This defines the pseudo-random number for rotating the columns of the 2-D store. After each column the linear feedback shift register is clocked once to get the next pseudo random number for rotating the next column. The addition operation shown in FIG. 4 is an addition in the Galois field GF[2], that is, an exclusive-OR operation between two binary bits. This linear feedback shift register generates a sequence of 63 pseudo-random 6-bit numbers in 63 successive clock cycles.

The binary number X[5:0] can be used to rotate the columns. This number is initialized to 17 at the beginning of each OFDM symbol. The column 0 is rotated by 17. Subsequent columns are rotated by values obtained by clocking shift register 400.

Figure 5:
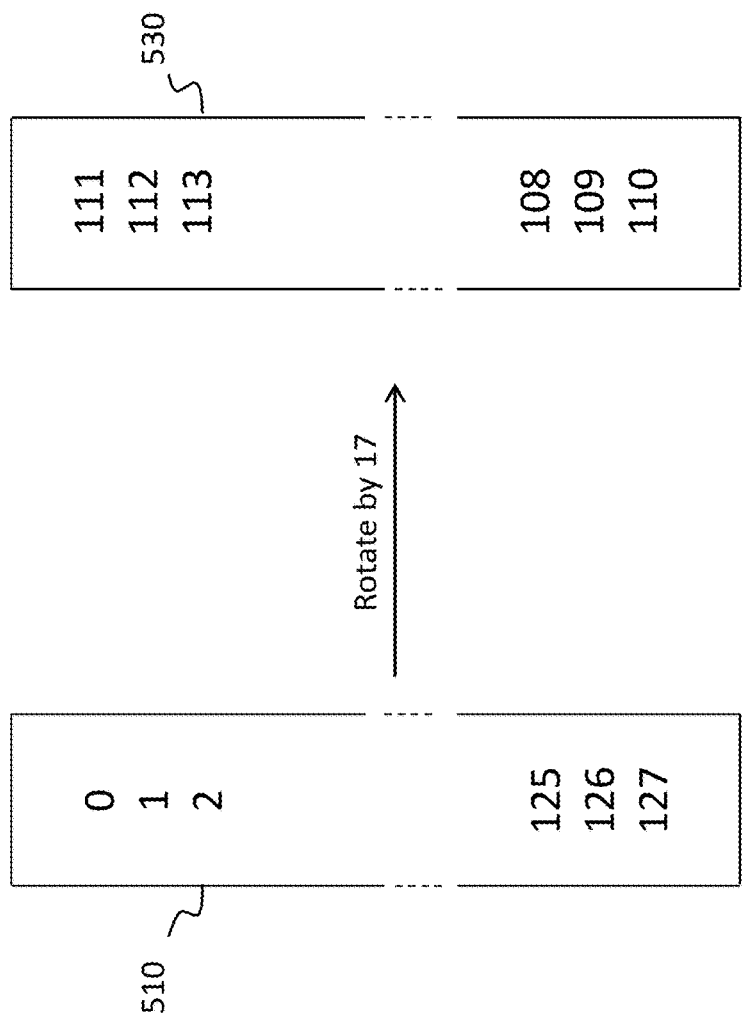
FIG. 5 shows an exemplary column rotation according to one embodiment of the disclosure.

FIG. 5 shows an exemplary column rotation according to one embodiment of the disclosure. Here, column 510 is rotated by 17 spaces to column 530.

In one embodiment of the disclosure, column (K−1) is not rotated regardless of whether the column is partially or completely full. Since all other columns are rotated by non-zero amount there is no need to rotate column (K−1). The non-rotation of column (K−1) also simplifies the design. In another embodiment of the disclosure column (K−1) may be rotated.

Figure 6:
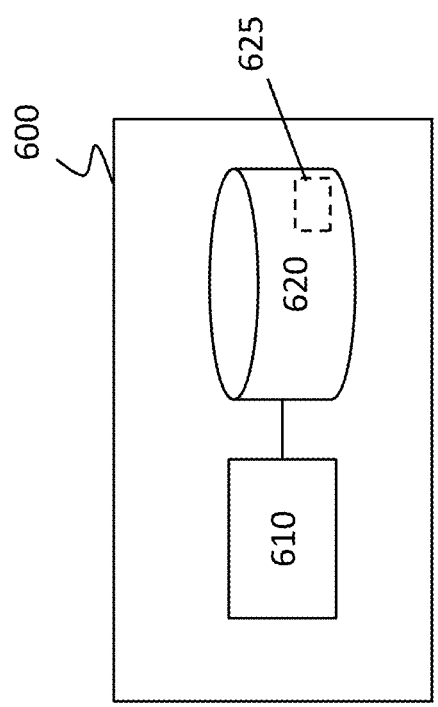
FIG. 6 shows an exemplary frequency interleaver.

FIG. 6 shows an exemplary frequency interleaver according to one embodiment of the disclosure. Interleaver 600 can be used as a frequency interleaver or it may be used as a time and frequency interleaver. Interleaver 600 includes processor 610 communicating with memory 620. Memory 620 may further comprise database file 625 for maintaining 2-D store (not shown). Processor 610 may include a shift register circuit. Memory 620 can include instructions for operating processor 610 to frequency interleave according to the bit-reversed order described herein. File 625 enables processor 610 to conduct read/write operation and to create 2-D store for the incoming data. For brevity, the I/O connections of interleaver 600 are not shown.

Referring once again to FIG. 1, frequency interleaver 116 outputs interleaved symbols to modulator 118. The OFDM modulator 118 implements an IFFT operation of the interleaved symbol after the insertion of pilot and any other special subcarriers into the symbol. The modulator may then prepend a cyclic prefix and apply windowing to the OFDM symbols in the time domain. The resulting baseband signal is then translated to a high carrier frequency, say 1 GHz, for transmission over the channel. The above operations are all part of the OFDM modulator 118 of FIG. 1.

The receiver side of the communication system comprises Demodulator 130, Frequency De-Interleaver 132, Time De-Interleaver 134, OFDM De-Mapper 136 and LDPC Decoder 138. Demodulator 130 receives and separates the data in the form of OFDM symbols from the carrier signal. Demodulator 130 performs the reverse function of the modulator described above. The demodulator 130 first brings the signal to baseband and identifies the locations of the data blocks that constitute OFDM symbols. It then computes the FFTs of these data blocks to yield data subcarriers and the pilot subcarriers. Some pilot subcarriers may be used for timing and frequency synchronization. If the channel has micro-reflections, there will peaks and troughs in the frequency response which have to be equalized at the receiver. Some pilot subcarriers are used to estimate the channel frequency response and this is used to equalize the OFDM signal. The above operations are all part of the OFDM demodulator 130 of FIG. 1.

Figure 7:
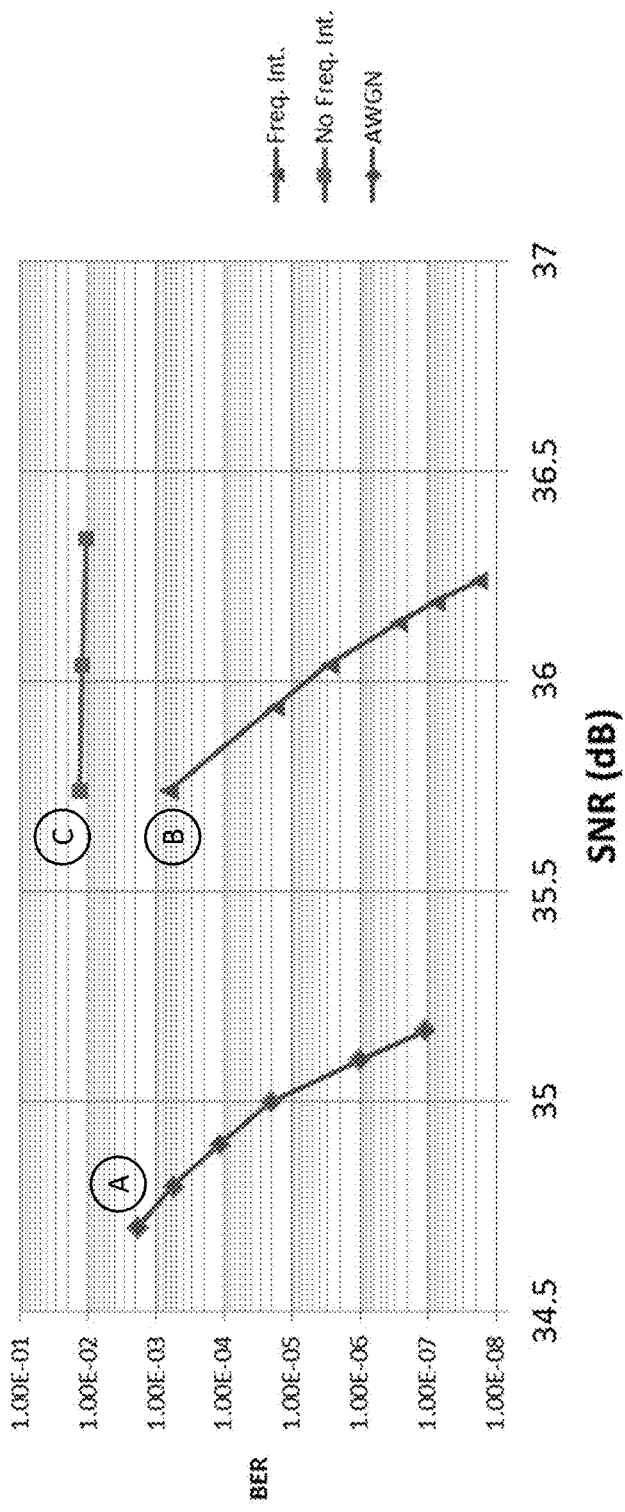
FIG. 7 shows performance of an exemplary interleaver obtained through simulation.

Performance of an exemplary interleaver, obtained through simulation, is shown in FIG. 7. Specifically, FIG. 7 shows a 4096-QAM OFDM transmission employing a 4096-point Fast Fourier Transform with 3840 subcarriers covering a bandwidth of 192 MHz. In the simulation a 10 MHz wide interference was added. The signal to noise ratio (SNR) in this 10 MHz wide frequency band was 20 dB. Graph B shows the LDPC decoded bit error rate versus SNR in the presence of the frequency interleaving and de-interleaving algorithm. Graph C shows the effect of removing the frequency interleaving and de-interleaving. Graph A is for reference purposes and shows performance without interference. Without interference, frequency interleaving and de-interleaving has no impact on performance. This leads to the conclusion that without frequency interleaving and de-interleaving the system fails to work. With frequency interleaving and de-interleaving the system works but with a 1 dB performance loss measured in terms of SNR, with reference to a system that does not have this interference.

Figure 8:
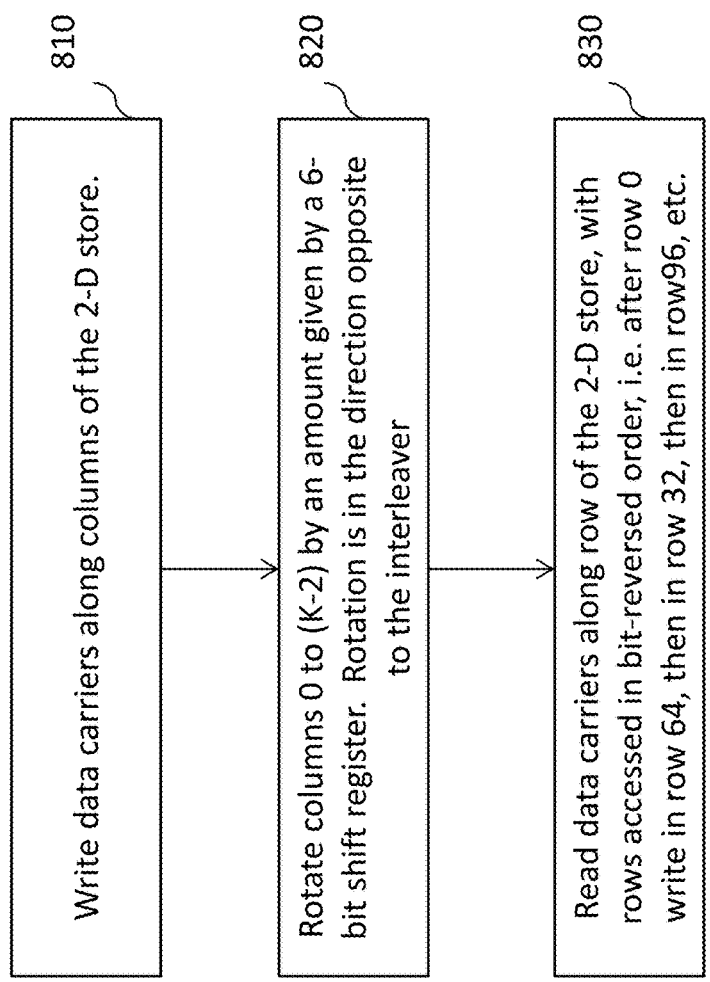
FIG. 8 is a flow-diagram of an exemplary frequency de-interleaving process.

FIG. 8 is a flow-diagram of an exemplary frequency de-interleaving process. As with the interleaver, the steps of the exemplary frequency de-interleaving may be implemented as hardware, software, firmware or a combination thereof. An exemplary may include one or more processor with the processor having one or more modules for implementing the steps of FIG. 8. An exemplary device may include one or more modules, where each module may include one or more processor and/or memory circuits. The frequency de-interleaving process is the reverse of the interleaving process described above. The process begins at step 810 by writing the data carriers along columns. The last column may be partially filled. At step 820, columns 0 to (K−2) are rotated by an amount given by a 6-bit shift linear feedback shift register. The shift register is initialized to a value of 17 at the start of each OFDM symbol and is clocked once after getting the value of rotation for each column. As with the transmitter side, the final column—which may be partially filled—is not rotated. The rotation is opposite in direction to the rotation in the frequency interleaving process. Finally, at step 830 the rows are read in bit-reversed order. Row 0 can be read first, followed by rows 64, 32, etc.

Column rotation can be used to break periodicity in the de-interleaver. Periodicity is not desired in frequency de-interleavers because the frequency interleavers are often periodic. Also, troughs caused by echoes also have periodic patterns. Thus, if there is any periodicity in the de-interleaving process, the system is susceptible to mapping a disproportionate number of weak carriers (i.e., carriers with poorer SNR) into a single LDPC block. Column rotation disclosed herein can break periodicity.

If the transmitter used time interleaving, time De-Interleaver 134 may be optionally added. OFDM De-Mapper 136 follows De-Interleaver 134 and de-maps the symbols. Bit-reversed row reading ensures maximum separation of the subcarriers in columns. This prevents consecutive subcarriers being read into one LDPC codeword. Several rows of the block de-interleaver will map onto a single LDPC block. Hence, if bit-reversed row access is not implemented a disproportionate number of adjacent carriers will map into one LDPC block through LDPC Decoder 138. Bit-reversed addressing prevents such occurrences. Finally, data 102 is provided as output of LDPC decoder 138.

Figure 9:
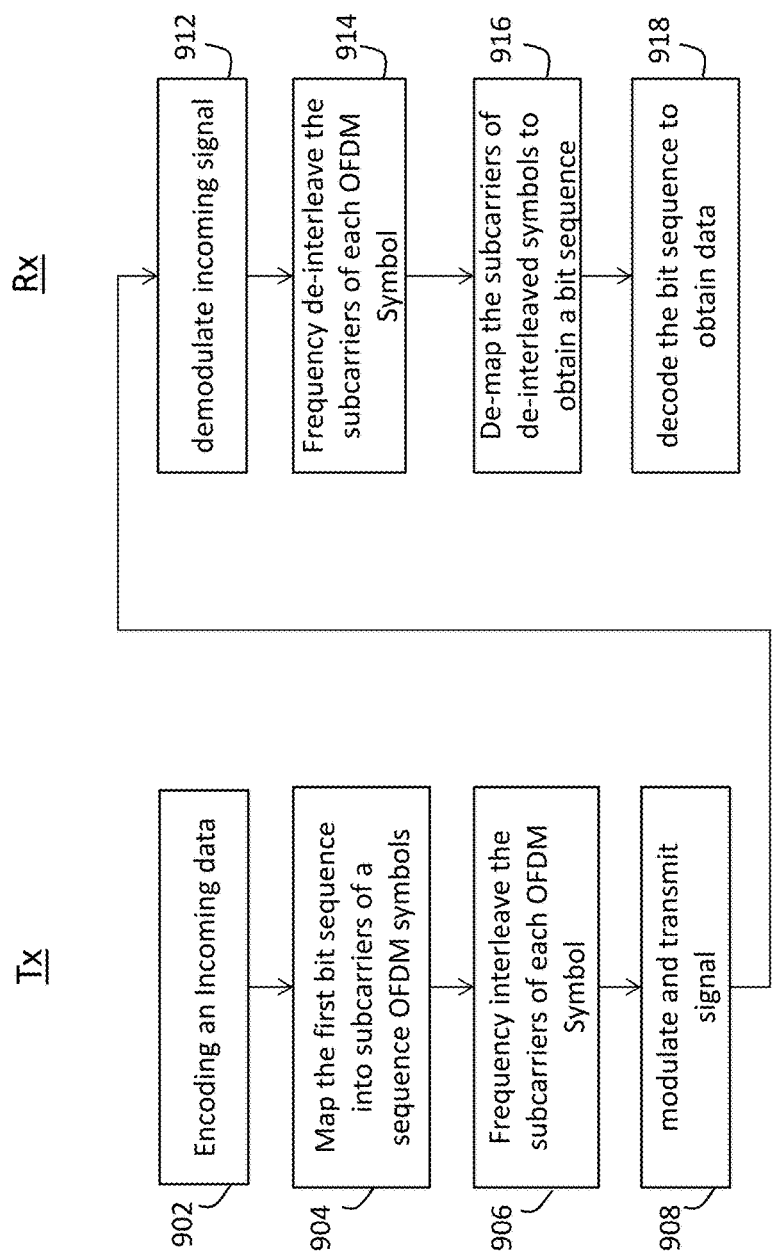
FIG. 9 is a flow-diagram showing an exemplary system implementation according to one embodiment of the disclosure.

FIG. 9 is a flow-diagram of an exemplary implementation according to one embodiment of the disclosure. FIG. 9 shows the operation at both the transmitter (Tx) and the receiver (Rx). The process starts at step 902 on the Tx side where incoming data is encoded into a first bit sequence. At step 904, the first bit sequence is mapped into one or more subcarriers to form multiplexed symbols. At step 906, the multiplexed symbols are interleaved to form interleaved symbols. Bit-reversed order frequency interleaving algorithm may be used for step 906. As part of the interleaving process, the bit-reversed order symbols can be written into 128 rows and K columns of a 2-D store. At step 98, the bit-reversed symbols of the 2-D store are modulated onto a carrier signal and transmitted over the medium.

On the Rx side of FIG. 9, the carrier signal is received and demodulated at step 912 to remove the carrier signal and generate a sequence of OFDM symbols. Each multiplexed symbol may comprise a plurality of subcarriers.

The subcarriers of each OFDM symbol are frequency de-interleaved at step 914. As part of the de-interleaving process, subcarriers of a symbol can be written into K columns and read along 128 rows of a 2-D store in bit-reversed order, after column de-rotation. At step 916, the de-interleaved symbols are de-mapped to obtain a first bit sequence. Finally, at step 918, the first bit sequence is decoded to recapture the transmitted data.

It is noted that the nominal channel bandwidth of next generation DOCSIS is 192 MHz. A substantial portion of the bandwidth is consumed by legacy channels and the number of active data carriers will vary from one system to another. The disclosed method and apparatus are equally applicable to systems where the number of data carriers vary significantly from one system to another.

Figure 10:
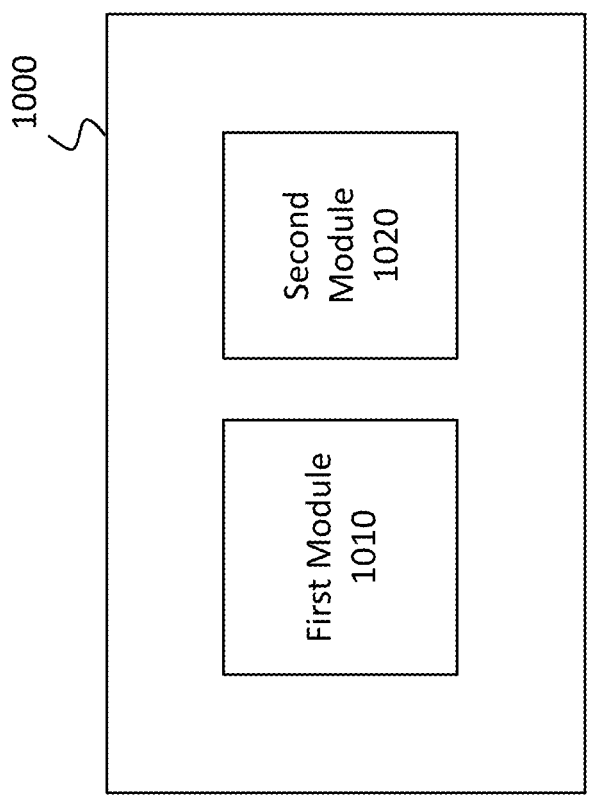
FIG. 10 schematically illustrates an apparatus for implementing an embodiment of the disclosure.

FIG. 10 schematically illustrates an apparatus for implementing an embodiment of the disclosure. Specifically, FIG. 10 shows device 1000 which can be an integral part of a larger system or can be a stand-alone unit. For example, device 1000 can define a system on chip configured to implement the disclosed methods. Device 1000 may also be part of a larger system having multiple antennas, a radio and a memory system. Device 1000 includes first module 1010 and second module 1020. Modules 1010 and 1020 can be hardware, software or a combination of hardware and software. Further, each of module 1010 and 1020 can define one or two independent processor circuits. In an exemplary embodiment, at least one of modules 1010 or 1020 includes a processor circuit and a memory circuit communicating with each other. In another embodiment, the modules 1010 and 102 define different part of the same data processing circuit.

In an exemplary embodiment, first module 1010 is configured to access or write data carriers along a plurality of rows and columns of a 2-D store in bit-reversed order as described above. The 2-D store can have n rows and k columns, where k may or may not be a integer multiple of n. The first module may also include a linear shift register (not shown) to rotate each column of the 2-D store in a pseudo random order. The amount of rotation, for example, can be obtained from clocking a 6-bit linear feedback shift register. In an exemplary embodiment, the data subcarriers are written in the 2-D store. The second module 1020 can be configured to read the columns of the 2-D store.

An embodiment of the disclosure relates to a communication system having one or more antennas, a radio, a memory circuit, and a processor circuit. The antennas can be used to communicate the signal or to comply with different transmission protocols. The radio can be any conventional circuit(s) configured to send and receive radio signals. The memory can communicate with the processor circuit and contain instructions for the processor circuit to write data carriers along a plurality of rows and columns of a 2-D store in bit-reversed order and read the columns of 2-D store. In an exemplary embodiment, device 1000 defines the processor circuit.

The following examples pertain to further embodiments of the disclosure. Example 1 includes a processor comprising: a first module configured to write data carriers along a plurality of rows and columns of a 2-D store in bit-reversed order; and a second module to read the columns of 2-D store.

Example 2 includes the processor of example 1, wherein the first module is configured to rotate the columns of the 2-D store by an amount before a column is read. Example 3 includes the processor of examples 1 or 2, wherein the first module is configured to rotate each column of the 2-D store in a pseudo random order.

Example 4 includes the processor of example 3, where in the first module further comprises a linear shift register configured to determine the pseudo random order.

Example 5 includes the processor of any of examples 1-4, wherein the 2-D store comprises n rows and K columns.

Example 6 includes the processor of example 5, wherein K is an integer multiple of n.

Example 7 includes the processor of example 5, wherein K is not an integer multiple of n.

Example 7 includes the processor of any of examples 1-5, wherein the first module is further configured to write a plurality of data subcarriers in the 2-D matrix.

Example 9 includes a method comprising writing data carriers associated with one or more symbols at a plurality of rows and columns of a 2-D store stored at a memory, the rows accessed in bit-reversed order; and reading the columns of 2-D store from the memory.

Example 10 includes the method of example 9, further comprising rotating the columns of the 2-D store by an amount before reading the columns.

Example 11 includes the method of examples 9 or 10, further comprising rotating the columns of the 2-D store in a pseudo random order.

Example 12 includes the method of any of examples 9-11, wherein the 2-D store comprises n rows and k columns where K is a integer multiple of n.

Example 13 includes the method of any of examples 9-11, wherein the 2-D store comprises n rows and k columns where K is not a integer multiple of n.

Example 14 includes the method of example 9, further comprising writing data subcarriers at the plurality of rows and columns of a 2-D store.

Example 15 includes an apparatus for performing the method of any of examples 9-14.

Example 16 includes a communication system, comprising an encoder to encode data into a first bit sequence; a mapper to map the first bit sequence onto one or more Orthogonal Frequency-Division Multiplexed (OFDM) symbols; a frequency interleaver to interleave the OFDM symbols according to a bit-reversed order; a modulator to modulate the interleaved symbols into a signal; and one or more antennas to transmit the signal.

Example 17 includes a communication system of example 16, further comprising a time interleaver.

Example 18 includes the communication system of examples 16 or 17, wherein the frequency interleaver is configured to write data carriers along rows of the 2-D store and to rotate each column of the 2-D store by an amount.

Example 19 includes the communication system of example 18, wherein the amount is a pseudo random value.

Example 20 includes a computer-readable storage device containing a set of instructions to cause a computer to perform a process comprising write data carriers along a plurality of rows and columns of a 2-D store in bit-reversed order; and read the columns of 2-D store.

Example 21 includes the computer-readable storage device of example 20, further comprising instructions to rotating the columns of the 2-D store in a pseudo random order.

Example 22 includes the computer-readable storage device of examples 20 or 21, further comprising instructions to write data carriers along a plurality of n rows and k columns, wherein k is a multiple integer of n.

Example 23 includes the computer-readable storage device of examples 20 or 21, further comprising instructions to write data carriers along a plurality of n rows and k columns, wherein k is not a multiple integer of n.

Example 24 includes a communication system, comprising one or more antennas; a radio; a memory circuit; and a processor circuit to write data carriers along a plurality of rows and columns of a 2-D store in bit-reversed order; and read the columns of 2-D store.

Example 25 includes a communication system of example 24, wherein the 2-D store comprises n rows and k columns.

Example 26 includes a device comprising: a first module configured to write a plurality of data carriers along a plurality of rows and columns of a 2-D store; and a second module to read data carriers along the plurality of columns and rows of the 2-D store, wherein the plural of rows of the 2-D store are accessed in bit-reversed order.

Example 27 includes the device of example 26, wherein one of the second module is further configured to rotate columns of the 2-D store by an amount before a column is read.

Example 28 includes the device of example 26, wherein the first module is configured to rotate each column of the 2-D store in a pseudo random order.

Example 29 includes the device of example 26, wherein the 2-D store comprises n rows and K columns.

Example 30 includes the device of example 29, wherein the first module is configured to rotate columns 0 to (K−2) by an amount given by an amount.

Example 31 includes a method comprising: writing data carriers associated with one or more symbols at a plurality of rows and columns of a 2-D store stored at a memory; and reading data carriers along row of the 2-D store, with rows accessed in bit-reversed order.

Example 32 includes the method of example 31, further comprising rotating the columns of the 2-D store by an amount before reading the columns.

Example 33 includes the method of example 31, further comprising writing data subcarriers at the plurality of rows and columns of a 2-D store.

While the principles of the disclosure have been illustrated in relation to the exemplary embodiments shown herein, the principles of the disclosure are not limited thereto and include any modification, variation or permutation thereof.

What is claimed is:

1. A communication system including a memory and a processor circuit coupled to the memory, the processor circuit to:
   perform frequency interleaving by:
      writing data carriers of an Orthogonal Frequency Division Multiplexing (OFDM) symbol in a bit-reversed order along rows of a 2-D store, the 2-D store further defining columns and being stored in the memory;
      rotating the columns of the 2-D store by an amount defined by a pseudo-random number generator; and
      reading the columns after the rotation thereof to output an interleaved OFDM symbol; and modulate the interleaved OFDM symbol by performing an inverse Fourier transform on the interleaved OFDM symbol to generate a modulated OFDM symbol for transmission over a wireless channel.

2. The communication system of claim 1, wherein the 2-D store defines 128 rows and K columns, wherein K is an integer.

3. The communication system of claim 1, wherein a last column of the 2-D store is to be partially filled with some data carriers of the data carriers when a total number of the data carriers is less than a number of the rows multiplied by a number of the columns.

4. The communication system of claim 1, wherein the processor circuit is further to map incoming data code words to symbols having orthogonal subcarriers to generate the OFDM symbol.

5. The communication system of claim 1, wherein the incoming data code words are incoming Low Density Parity Check (LDPC) codewords, the processor circuit further to encode incoming data to generate the LDPC codewords.

6. The communication system of claim 1, wherein the processor circuit is further to modulate the OFDM symbol by prepending a cyclic prefix and applying windowing to the OFDM symbol after performing the inverse Fourier transform.

7. The communication system of claim 1, wherein a signal corresponding to the modulated OFDM symbol is to have a frequency of 1 GHz over the wireless channel.

8. The communication system of claim 1, wherein the wireless channel is to have a bandwidth of 192 MHz.

9. The communication system of claim 1, wherein the pseudo-random number generator corresponds to a 6-bit shift maximal length linear feedback shift register.

10. The communication system of claim 9, wherein the processor circuit is to initialize the 6-bit shift maximal length linear feedback shift register to a value of 17 at a start of each OFDM symbol.

11. The communication system of claim 10, wherein the processor circuit is to rotate the columns without rotating a last column of the columns.

12. The communication system of claim 1, wherein the processor circuit is to perform time interleaving of the OFDM symbol prior to performing frequency interleaving of the OFDM symbol.

13. The communication system of claim 1, further including a radio coupled to the processor circuit to receive the modulated OFDM symbol for transmission.

14. The communication system of claim 13, further including one or more antennas coupled to the radio to transmit the OFDM symbol.

15. A non-transitory computer-readable storage device embedded with a set of instructions to cause a computer to perform a process to prepare data for transmission in a wireless medium, the process including:
performing frequency interleaving by:
writing data carriers of an Orthogonal Frequency Division Multiplexing (OFDM) symbol in a bit-reversed order along rows of a 2-D store, the 2-D store further defining columns and being stored in a memory of the computer;
rotating the columns of the 2-D store by an amount defined by a pseudo-random number generator; and
reading the columns after the rotation thereof to output an interleaved OFDM symbol; and
modulating the interleaved OFDM symbol by performing an inverse Fourier transform on the interleaved OFDM symbol to generate a modulated OFDM symbol for transmission over a wireless channel.

16. The non-transitory computer-readable storage device of claim 15, wherein the 2-D store defines 128 rows and K columns, wherein K is an integer.

17. The non-transitory computer-readable storage device of claim 15, wherein a last column of the 2-D store is to be partially filled with some data carriers of the data carriers when a total number of the data carriers is less than a number of the rows multiplied by a number of the columns.

18. The non-transitory computer-readable storage device of claim 15, wherein the process further includes mapping incoming data code words to symbols having orthogonal subcarriers to generate the OFDM symbol.

19. The non-transitory computer-readable storage device of claim 15, wherein the incoming data code words are incoming Low Density Parity Check (LDPC) codewords, the processor circuit further to encode incoming data to generate the LDPC codewords.

20. The non-transitory computer-readable storage device of claim 15, wherein the process further includes modulating the OFDM symbol by prepending a cyclic prefix and applying windowing to the OFDM symbol after performing the inverse Fourier transform.

21. The non-transitory computer-readable storage device of claim 15, wherein a signal corresponding to the modulated OFDM symbol is to have a frequency of 1 GHz over the wireless channel.

22. The non-transitory computer-readable storage device of claim 15, wherein the wireless channel is to have a bandwidth of 192 MHz.

23. The non-transitory computer-readable storage device of claim 15, wherein the pseudo-random number generator corresponds to a 6-bit shift maximal length linear feedback shift register.

24. The non-transitory computer-readable storage device of claim 23, wherein the process further includes initializing the 6-bit shift maximal length linear feedback shift register to a value of 17 at a start of each OFDM symbol.

25. The non-transitory computer-readable storage device of claim 24, wherein the process further includes rotating the columns without rotating a last column of the columns.

26. A method to be performed at a communication system, the method including:
performing frequency interleaving by:
writing data carriers of an Orthogonal Frequency Division Multiplexing (OFDM) symbol in a bit-reversed order along rows of a 2-D store, the 2-D store further defining 128 rows and K columns and being stored in a memory of the communication system;
rotating the columns, except for a last column, of the 2-D store by an amount defined by a 6-bit shift maximal length linear feedback shift register; and
reading the columns after the rotation thereof to output an interleaved OFDM symbol; and
modulating the interleaved OFDM symbol by performing an inverse Fourier transform on the interleaved OFDM symbol to generate a modulated OFDM symbol for transmission over a wireless channel.

27. The method of claim 26, wherein the method further includes initializing the 6-bit shift maximal length linear feedback shift register to a value of 17 at a start of each OFDM symbol.

* * * * *